United States Patent
Düsel et al.

(10) Patent No.: US 11,800,644 B2
(45) Date of Patent: Oct. 24, 2023

(54) POWER ELECTRONIC SWITCHING DEVICE, POWER SEMICONDUCTOR MODULE THEREWITH AND METHOD FOR PRODUCTION

(71) Applicant: SEMIKRON ELEKTRONIK GMBH & CO. KG, Nuremberg (DE)

(72) Inventors: Markus Düsel, Hallerndorf (DE); Michael Schatz, Nuremberg (DE); Alexander Wehner, Nuremberg (DE); Ingo Bogen, Nuremberg (DE); Jürgen Steger, Hiltpoltstein (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 17/385,320

(22) Filed: Jul. 26, 2021

(65) Prior Publication Data
US 2022/0046798 A1    Feb. 10, 2022

(30) Foreign Application Priority Data

Aug. 10, 2020  (DE) ............. 10 2020 121 033.7

(51) Int. Cl.
*H05K 1/18*    (2006.01)
*H05K 1/02*    (2006.01)
(Continued)

(52) U.S. Cl.
CPC ......... *H05K 1/181* (2013.01); *H01L 23/4985* (2013.01); *H01L 23/49811* (2013.01);
(Continued)

(58) Field of Classification Search
CPC .... H05K 1/181; H05K 1/0298; H05K 3/4644; H05K 2201/09045; H05K 2201/09309;
(Continued)

(56) References Cited

U.S. PATENT DOCUMENTS

2010/0051325 A1*  3/2010  Sato ............... H05K 3/4652
                                                174/254
2010/0090328 A1*  4/2010  Goebl ............ H01L 24/50
                                                257/E21.501
(Continued)

FOREIGN PATENT DOCUMENTS

DE    102007096706 A1    8/2008
DE    102007044620 A1    4/2009
(Continued)

OTHER PUBLICATIONS

English Translation DE102017122557, Semikron Elektronik GmbH, and Co KG (Year: 2017).*
(Continued)

*Primary Examiner* — Steven T Sawyer
(74) *Attorney, Agent, or Firm* — Andrew F. Young; NOLTE LACKENBACH SIEGEL

(57) ABSTRACT

A production method and a power electronic connecting device for a power semiconductor module, wherein the connecting device is designed as a flexible film stack of a first and a second electrically conductive film and an electrically insulating film arranged therebetween, wherein at least one of the electrically conductive films is structured in itself and thus forms a plurality of film conductor tracks, wherein a first one of these film conductor tracks has, in a first section, a first average thickness and, in a second section, a second average thickness which is at least 10%, preferably at least 20%, smaller than the first average thickness.

20 Claims, 5 Drawing Sheets

(51) Int. Cl.
*H05K 3/46* (2006.01)
*H01L 23/498* (2006.01)
*H01L 21/48* (2006.01)

(52) U.S. Cl.
CPC ......... *H05K 1/0298* (2013.01); *H05K 3/4644* (2013.01); *H01L 21/4846* (2013.01); *H05K 1/189* (2013.01); *H05K 2201/09045* (2013.01); *H05K 2201/09736* (2013.01)

(58) Field of Classification Search
CPC .......... H05K 2201/09736; H05K 1/189; H01L 2224/18; H01L 23/49811; H01L 21/4846; H01L 23/49838; H01L 23/4985; H01L 24/72; H01L 23/36; H01L 23/4093; H01L 24/50; H01L 24/73; H01L 24/90; H01L 25/072; H01L 23/42; H01L 2224/24137; H01L 2224/24226; H01L 2224/50; H01L 2224/73267
See application file for complete search history.

(56) References Cited

U.S. PATENT DOCUMENTS

| | | | | |
|---|---|---|---|---|
| 2013/0176682 | A1* | 7/2013 | Besendorfer | H05K 7/2039 438/122 |
| 2015/0069599 | A1* | 3/2015 | Gobl | H01L 25/072 257/773 |
| 2015/0325494 | A1* | 11/2015 | Kroneder | H01L 23/043 361/715 |
| 2016/0120038 | A1* | 4/2016 | Göbl | H05K 3/32 29/832 |
| 2017/0092574 | A1* | 3/2017 | Wagner | H01L 23/49838 |
| 2018/0026005 | A1* | 1/2018 | Kobolla | H01L 24/50 257/688 |
| 2018/0070440 | A1* | 3/2018 | Hanya | H05K 1/0231 |

FOREIGN PATENT DOCUMENTS

| | | |
|---|---|---|
| DE | 102009024370 A1 | 12/2010 |
| DE | 102011078811 B3 | 5/2012 |
| DE | 102013102828 A1 | 9/2014 |
| DE | 102017122557 | 3/2019 |

OTHER PUBLICATIONS

English Translation DE102013108185, Ulrich et al., Semikron Elektronik GmbH, and Co KG (Year: 2013).*
English Translation DE102009024370, Tobias et al., Semikron Elektronik GmbH, and Co KG (Year: 2009).*
Amendment Claims to DE 10 2020 121 033.7, filed Aug. 10, 2020, amendment filed Jul. 6, 2021, 3 pages—German, 4 pages—English.
DE 10 2020 121 033.7, German Search Report dated Mar. 1, 2021, 5 pages—German, 6 pages—English.

* cited by examiner

POWER ELECTRONIC SWITCHING DEVICE, POWER SEMICONDUCTOR MODULE THEREWITH AND METHOD FOR PRODUCTION

CROSS REFERENCE TO RELATED APPLICATIONS

This application relates to and claims priority to DE 10 2020 121 033.7 filed Aug. 10, 2020, the entire contents of which are incorporated herein by reference.

FIGURE SELECTED FOR PUBLICATION

FIG. 2

BACKGROUND OF THE INVENTION

Field of the Invention

The invention relates to a power electronic connecting device designed as a flexible film stack of a first and a second electrically conductive film and an electrically insulating film arranged therebetween, wherein at least one of the electrically conductive films is structured in itself and thus forms a plurality of film conductor tracks. The film stack can have further alternately arranged electrically insulating and electrically conductive films. Furthermore, the invention describes a power semiconductor module with a connecting device of this type as well as a method for producing a connecting device of this type.

Description of the Related Art

DE 10 2007 006 706 A1 discloses a circuit arrangement with a substrate, conductor tracks which are arranged on a main surface of this substrate, at least one semiconductor component which is arranged with its first main surface on a first conductor track, an electrically conductive connecting device to at least one contact surface of the second main surface of the semiconductor component. In this case, the connection of the semiconductor component to the first conductor track and/or the connecting device is formed as a pressure sintering connection and an insulating material is arranged between the connecting device and an associated edge of the semiconductor component.

ASPECTS AND SUMMARY OF THE INVENTION

With the knowledge of the specified prior art, the underlying object of the invention is to hereby develop the power electronic connecting device and a power semiconductor module in order to better meet the various requirements for the current carrying capacity and for mechanical flexibility, as well as to specify a method for producing a connecting device of this type.

This object is achieved according to the invention by way of a power electronic connecting device designed as a flexible film stack of a first and a second electrically conductive film and an electrically insulating film arranged therebetween, wherein at least one of the electrically conductive films is structured in itself and thus forms a plurality of film conductor tracks, wherein a first one of these film conductor tracks has, in a first section, a first average thickness and, in a second section, a second average thickness which is at least 10%, preferably at least 20%, smaller than the first average thickness.

In this case, an average thickness is always determined orthogonally to the direction of current flow. In other words, a current flows through a surface element perpendicular to the direction of current flow, the average height of which corresponds to the average thickness of the section. This average height also corresponds to the height of a virtual surface element of the same surface area. The first average thickness advantageously has a value between 80 µm and 250 µm, preferably between 100 µm and 150 µm.

In this case, it is particularly preferable if the first film conductor track is provided in order to carry load currents of a power electronic switching device, in particular as part of a power semiconductor module.

It can also be particularly advantageous if the first film conductor track has an arcuate section, and the first section is part of this arcuate section or projects beyond this arcuate section at one end or at both ends.

It may be advantageous if the first film conductor track has an average width and the first section of the first film conductor track has a first minimum section width which is at least 10%, preferably at least 20%, smaller than the average width.

It can also be advantageous if the first film conductor track has an average width and the second section of the first film conductor track has a second minimum section width which is at least 10%, preferably at least 20%, greater than the average width.

An average width is therefore intended to be understood to mean the width of a virtual rectangle with the length of the film conductor track in each case.

It may also be advantageous if a surface of the first section of the first film conductor track, which surface faces away from the electrically insulating film, has a flat or a relief surface.

The proposed object and adaptive aspects of the present invention are further achieved by way of a power semiconductor module with a power electronic connecting device according to the claims with a substrate which has a plurality of conductor tracks which are electrically insulated from one another, with a power semiconductor component which is arranged on a first conductor track and which has a contact surface on its side which faces away from the substrate, to which contact surface a film conductor track of an electrically conductive film is connected in an electrically conductive manner.

In this case, it may be advantageous if the connecting device of the power semiconductor module has an arcuate path which begins in the edge area of the power semiconductor component and extends away from there.

The object is further achieved by way of a method for producing an aforementioned power electronic connecting device with the method steps which are preferably carried out in the sequence of a-b-c or b-a-c or b-c-a:
 a. forming a materially bonded connection, in particular an adhesive connection, of the film stack made up of a first electrically conductive, an electrically insulating and a second electrically conductive film;
 b. structuring at least one of the electrically conductive films to form a plurality of film conductor tracks;
 c. partially changing the thickness of a first film conductor track to form a first section with a first average thickness and a second section with a second average thickness.

In this case, it is advantageous if a first average thickness of the first section is generated by arranging a metal molding or a metal film in a materially-bonded manner or by arranging a metal in a materially-bonded manner, in particular by means of electrodeposition, on the free surface of the first section. A simple method as an alternative to electrodeposition is the application of a solder layer. This is particularly suitable for small areas.

It may also be preferable if a second average thickness of the second section is generated by means of mechanical, chemical or a combined mechanical-chemical thinning of this second section. For a mechanical method, grinding or milling are particularly suitable, for a chemical method, in particular etching. One particularly advantageous method for thinning is bombardment with particles, since this creates an inhomogeneous, chaotically structured surface.

In principle, it is preferable if the respective thickness of the electrically conductive film is between 10 µm and 500 µm, preferably between 50 µm and 250 µm, and if the thickness of the electrically insulating film is between 2 µm and 200 µm, preferably between 10 µm and 100 µm.

The method according to the invention and thus also the power electronic connecting devices which are correspondingly produced with said method have various advantages over the prior art. By adapting the thickness in a targeted manner, in particular to the load current which is to be carried in conjunction with the width of the conductor track, the configuration can, on the one hand, be optimized with respect to the current conduction. On the other hand, mechanical requirements, by way of example an increased flexibility in the area of arches, can be taken into account. In principle, there is greater freedom of design compared to the prior art.

Of course, the singularly specified features, in particular the first film conductor track, can also be present several times in the connecting device according to the invention, unless this is ruled out per se or explicitly. Within the scope of the power semiconductor module, the power semiconductor component can in particular be present multiple times and also in various configurations.

It is understood that the various configurations of the invention can be realized individually or in any combinations in order to achieve improvements. In particular, the features specified and explained previously and hereinafter, regardless of whether they are described within the scope of the power electronic connecting device, the power semiconductor module or the method, can not only be applied in the specified combinations but also in other combinations or in isolation, without departing from the scope of the present invention.

Further explanations of the invention, advantageous details and features are set forth in the subsequent description of the exemplary embodiments of the invention represented schematically in the figures or of respective parts thereof. In this case, a connecting device according to the invention is also always intended to be understood to mean a connecting device produced according to the invention.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
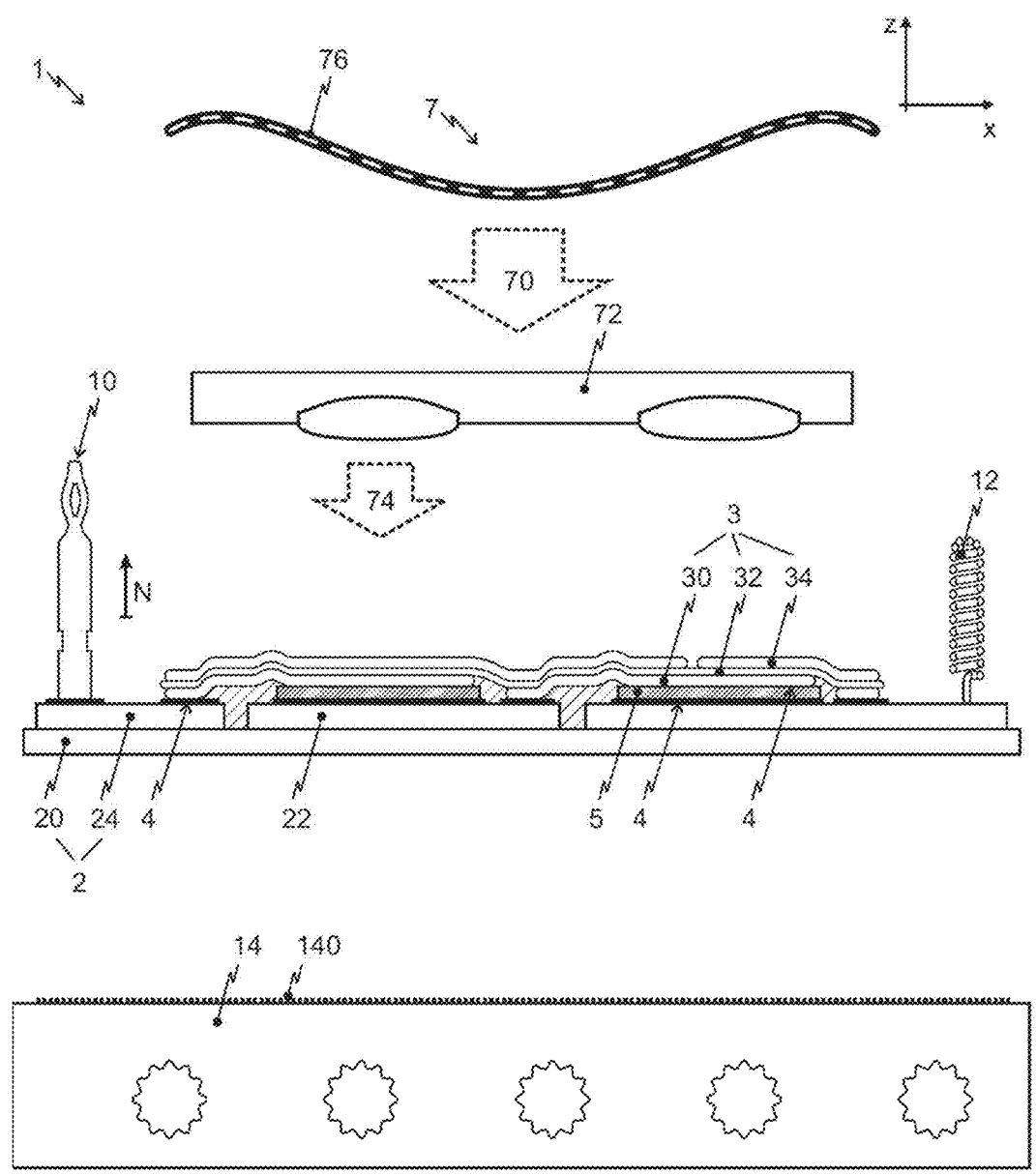
FIG. 1 shows an arrangement with a power electronic switching device with a power electronic connecting device according to the prior art in a lateral sectional view.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Referring to FIGS. 1-7, and in FIG. 1 shows, in a schematic exploded representation and in a lateral view, a power electronic switching device 1 as part of a power semiconductor module according to the prior art for arranging on a cooling device, here designed as a liquid cooling device 14. A substrate 2 which is basically designed in a standard manner is represented with an insulating material body 20 and conductor tracks 22,24, arranged thereon and in each case electrically insulated from one another, which have different potentials, in particular load potentials but also auxiliary potentials, in particular control potentials and measurement potentials, of the switching device. Three conductor tracks 22,24 for load potentials which are typical for a switching device in half bridge topology are specifically represented here.

A power semiconductor component 5 is arranged on a first conductor track 22, which power semiconductor component can be designed in a standard manner as an individual switch, by way of example as a MOS-FET, or as an IGBT with a power diode connected in antiparallel which is represented here. The power semiconductor components 5, more precisely their first contact surface of the first metallisation, are connected in a standard manner to the first conductor tracks 22 in a materially-bonded, electrically conductive manner, preferably by means of a pressure sintering connection 4.

The internal connections of the switching device 1 are formed, by means of a connecting device 3, from a film composite designed as a flexible film stack which has alternately electrically conductive films 30, 34 and electrically insulating films 32. Here, the film composite has precisely two conductive films and an insulating film arranged therebetween. In particular, the conductive films 30, 34 of the connecting device 3 are structured in themselves and thus form film conductor tracks which are electrically insulated from one another. In particular, these film conductor tracks connect the respective power semiconductor component 5, more precisely its second contact surface on the side which faces away from the substrate 2, to a second conductor track 24 of the substrate 2. Here, contact sections of the film conductor tracks are connected in a materially-bonded manner to the contact surfaces of the substrate 2 by means of a pressure sintering connection 4.

The power electronic switching device 1 has load and auxiliary connection elements for external electrical connection. Merely by way of example, a load connection element is designed as a metal molding 10 which is connected by a contact foot to a second conductor track 24 of the substrate 2 in a materially-bonded manner, advantageously also by means of a pressure sintering connection. It is also standard that auxiliary connection elements can be designed as contact springs 12. In principle, parts of the connecting device 3 itself can also be designed as load or auxiliary connection elements.

The pressure device 7 has a first main surface which faces the substrate 2 and a second main surface which faces away from the substrate 2 and, for the sake of clarity, is represented here as spaced apart from the connecting device 3. The pressure device 7 consists of a pressure body 72 and a plurality of pressure elements, two of which are represented. The pressure body 72 has a particularly rigid design, in order to be able to transmit the pressure applied to it to the pressure elements in a homogenous manner. The pressure elements are arranged in recesses of the pressure body which are designed as a depression starting from a first main surface.

The arrangement further has the liquid cooling device 14, the surface of which is covered with a heat conducting layer 140 on which the power electronic switching device 1, more precisely its substrate 2, is arranged.

Alternatively, the insulating material body 20 of the substrate 2 can be designed as an electrically insulating film which is laminated directly onto the heat sink 14. Even in this case, the conductor tracks 22,24 can be designed as flat line elements made of copper or aluminum.

The arrangement further has a pressure introduction device 76 which is arranged above the connecting device. By means of this pressure introduction device which, not represented, rests against the heat sink, pressure 70 is applied to the pressure body 72. In each case, this pressure is transferred directly onto the film composite as a partial pressure 74 by means of the pressure elements. The applied pressure presses the entire substrate 2 onto the heat sink 14.

Power semiconductor modules according to the invention may, of course, have components of the switching device described above according to the prior art which are not explicitly described. These power semiconductor modules according to the invention are also suitable and designed to be arranged on a heat sink, in particular a liquid heat sink, within the scope of a power electronic system.

Figure 2:
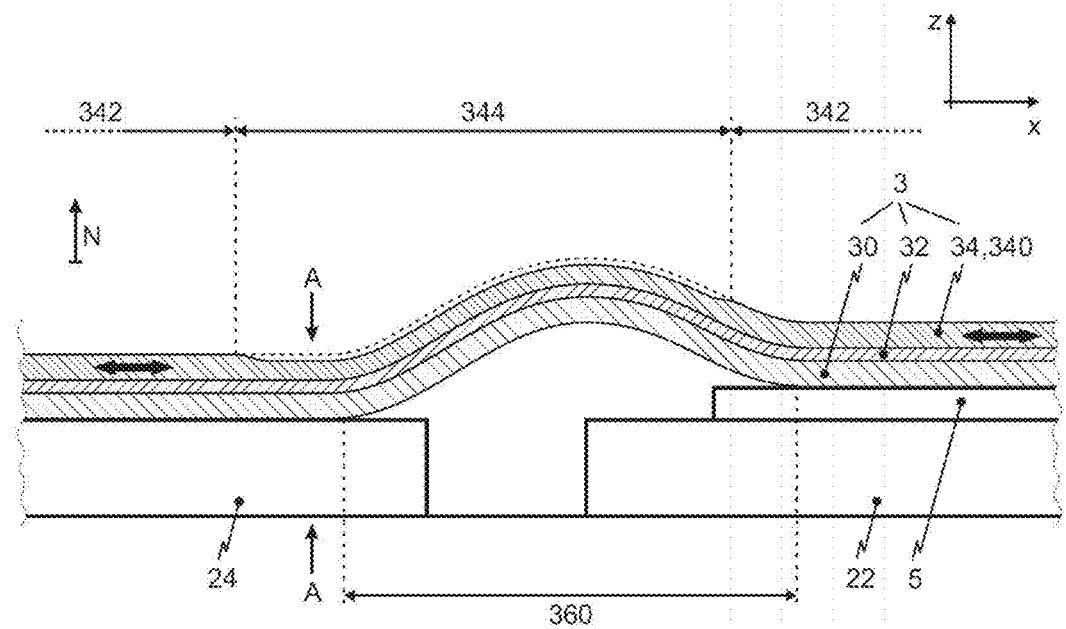
FIG. 2 shows a first configuration of a power electronic connecting device according to the invention.

FIG. 2 shows a first configuration of a power electronic connecting device 3 according to the invention, as well as a cut-out from a first power semiconductor module according to the invention. A first and a second conductor track 22,24 of the substrate 2 of the power semiconductor module are represented, wherein a power semiconductor component 5 is arranged on the first conductor track 22 and is connected in an electrically conductive manner, as described above in FIG. 1.

The connecting device 3 according to the invention has a first electrically conductive film 30 which faces the substrate 2 and which is connected to both the power semiconductor component 5 and the second conductor track 24 in the manner described above. In the normal direction N of the substrate 2, the first electrically conductive film 30 is followed by an electrically insulating and then a second electrically conductive film 32,34. From this second electrically conductive film 34, there is a first film conductor track 340 which has been created by structuring the film 34. In this case, spatially separated film conductor tracks 340, cf. also FIG. 4, arranged on the electrically insulating film 32 are in particular generated. The direction of current flow within the first film conductor track 340 is additionally represented by means of a double arrow.

The connecting device 3 has an arcuate section 360 in its path from the power semiconductor component 5 to the second conductor track 24. Viewed in the direction of current flow, a second section 344 of the first film conductor track 340 is arranged completely within this arcuate section 360. First sections 342 connect to said film conductor track on both sides respectively. In this case, the second section 344 has a second average thickness 844 which is 20% smaller than the first average thickness 842 of the first sections 342, cf. also FIG. 4.

Figure 3:
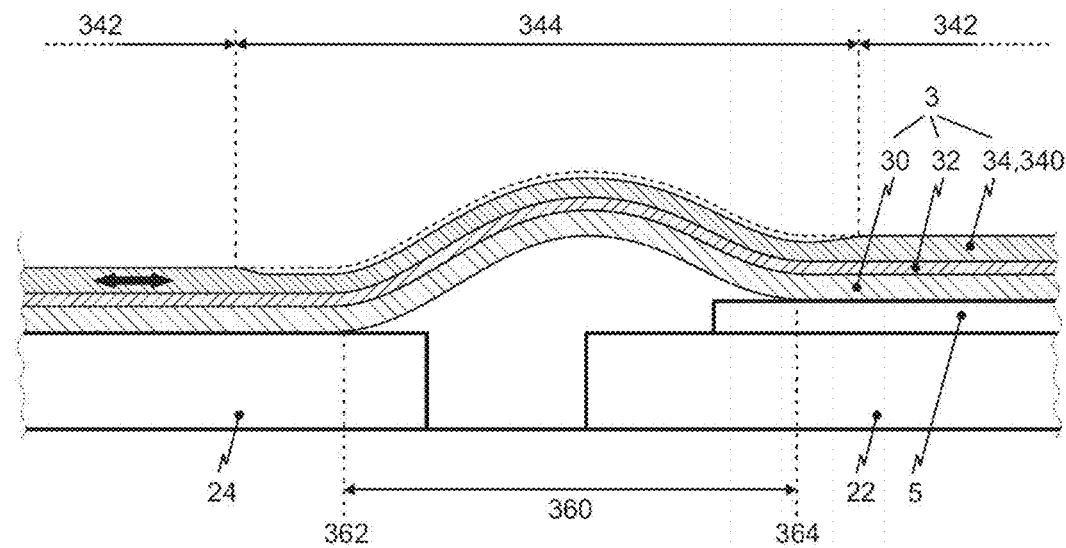
FIG. 3 shows a second configuration of a power electronic connecting device according to the invention.

FIG. 3 shows a second configuration of a power electronic connecting device 3 according to the invention, as well as a cut-out from a second power semiconductor module according to the invention. These configurations correspond as far as possible to those according to FIG. 2, but in this case the second section 344 of the first film conductor track 340, here in the area of the power semiconductor component, reaches beyond the arcuate section 360.

Figure 4:
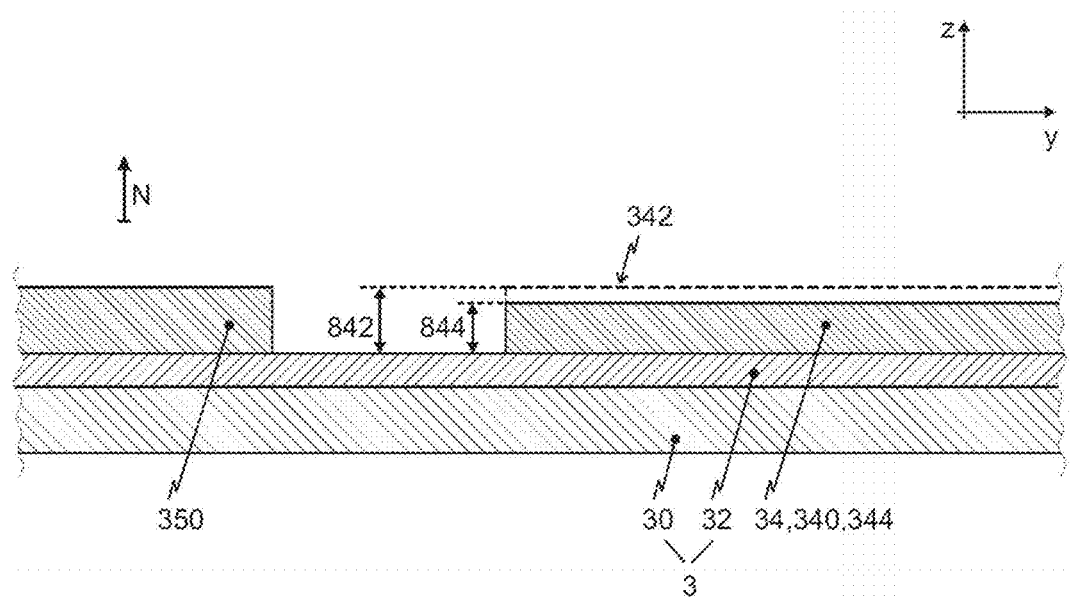
FIGS. 4 and 5 show cut-outs from power electronic connecting devices according to the invention.
Figure 5:
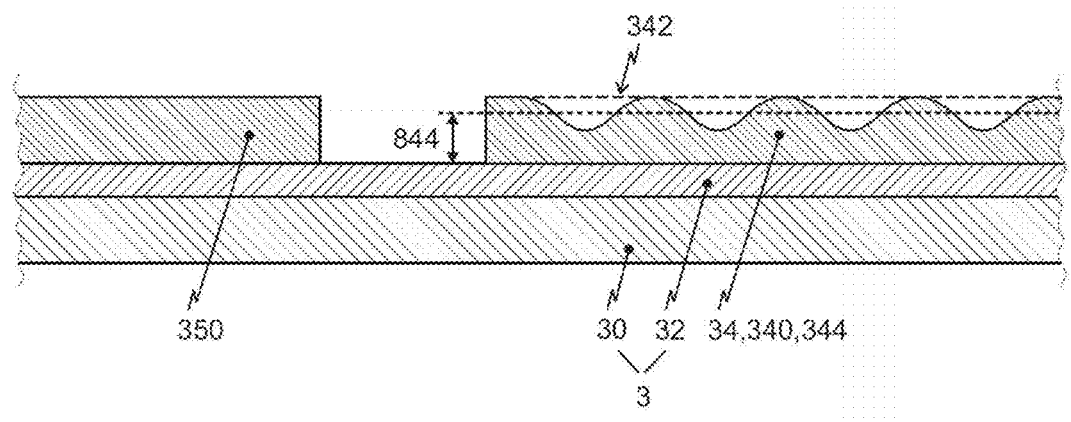

FIGS. 4 and 5 in each case show, in a lateral view, cut-outs from power electronic connecting devices 3 according to the invention with a first, here without loss of generality, non-structured electrically conductive film 30 to which an electrically insulating film 32 is directly connected and then, in turn, a second electrically conductive film 34 is directly connected. This second electrically conductive film 34 is structured in itself and here forms a first and a second film conductor track 340, 350 which are both completely electrically insulated from one another.

FIG. 4 represents a section which is perpendicular to the direction of current flow and along the plane A-A of the connecting device 3 according to FIG. 2. Here, the first film conductor track 340 has, in its second section 344, a constant second average thickness 844. The first section 342 of the first film conductor track 340, which has a first thickness 842 which is also the same as the thickness of the second film conductor track 350, is represented as dashed lines, effectively arranged in the background or in the viewing direction of the drawing plane behind it. Merely by way of example, the thickness of the electrically conductive films 30,34, without thickening or thinning, is 150 µm, that of the electrically insulating film is 30 µm. In this exemplary embodiment, the first average thickness is therefore 150 µm, while the second average thickness is 120 µm.

FIG. 5 represents a section which is perpendicular to the direction of current flow of a further connecting device 3. Here, the first film conductor track 340 has, in its second section 344, a second average thickness 844 which is formed by a wave profile. The first section 342 of the first film conductor track 340, which has a first thickness which is also the same as the thickness of the second film conductor track 350, is represented as dashed lines.

Figure 6:
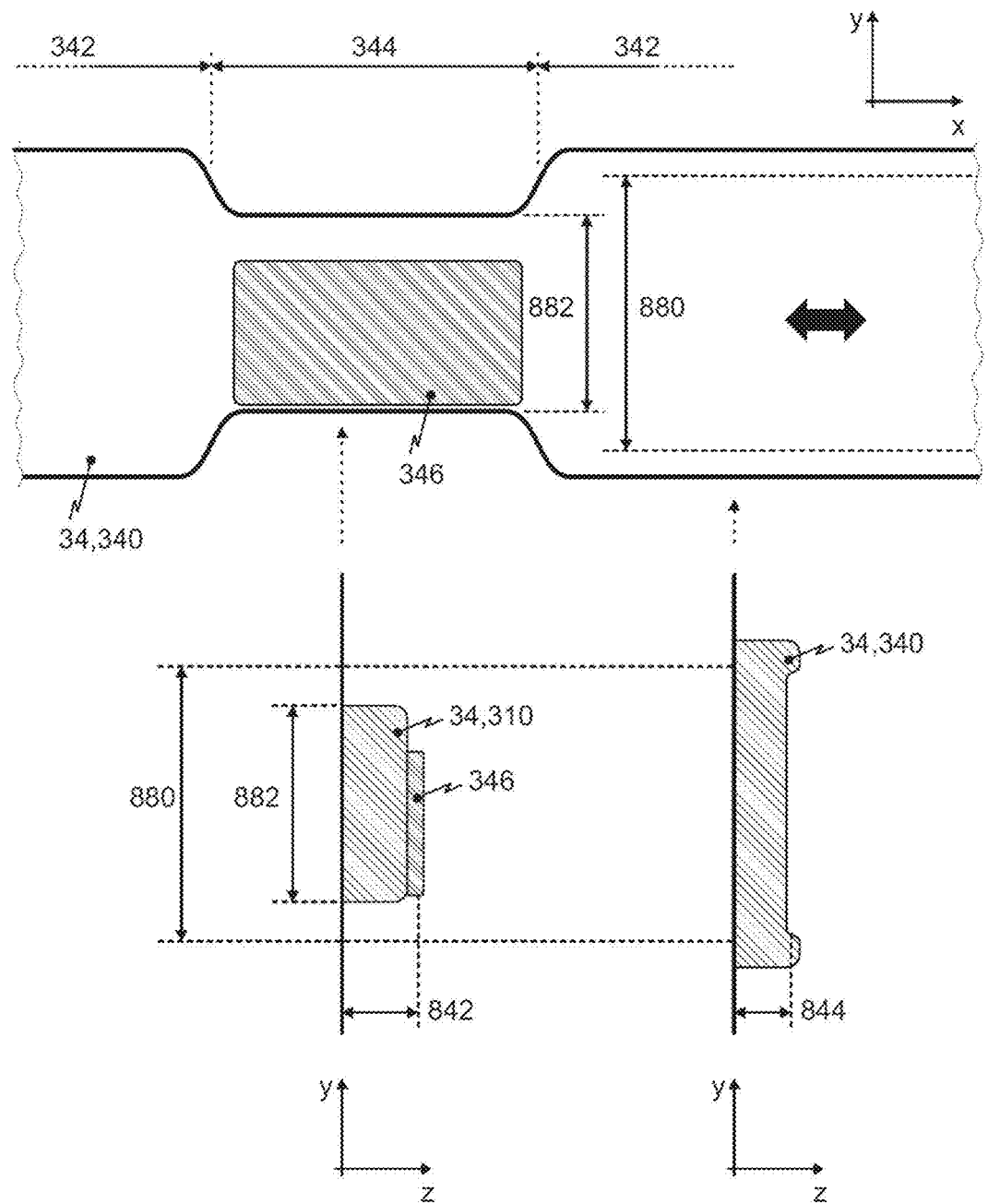
FIG. 6 shows different views of one part of a third configuration of the connecting device according to the invention.

FIG. 6 shows different views of one part of a third configuration of the connecting device 3 according to the invention. A plan view onto a first film conductor track 340 with a bottleneck is represented above. Two sections through two planes of this first film conductor track 340 are represented below respectively.

The first film conductor track 340 has, in a first section 342, a first average thickness 842 which has been generated by arranging a metal film 346 in a materially-bonded manner along the first section 342, but not over the entire width of this first section.

The first film conductor track 340 further has, in a second section 344, a second average thickness 844, which has been generated by mechanical thinning by means of milling, along the second section 344, but not over the entire width of this second section.

Furthermore, the first average width 880 of the first film conductor track 340 and also the second minimum section width 882 of the second section 344, which here is 20% smaller than the average width 880, is represented. The greater first average thickness 842 of this first section 342 compensates for the smaller width 880, since in principle the cross-sectional area is essential for the current carrying capacity. Of course, the same also applies in the reverse case for a second minimum section width 882 of a second section which compensates for a smaller second average thickness 844.

Figure 7:
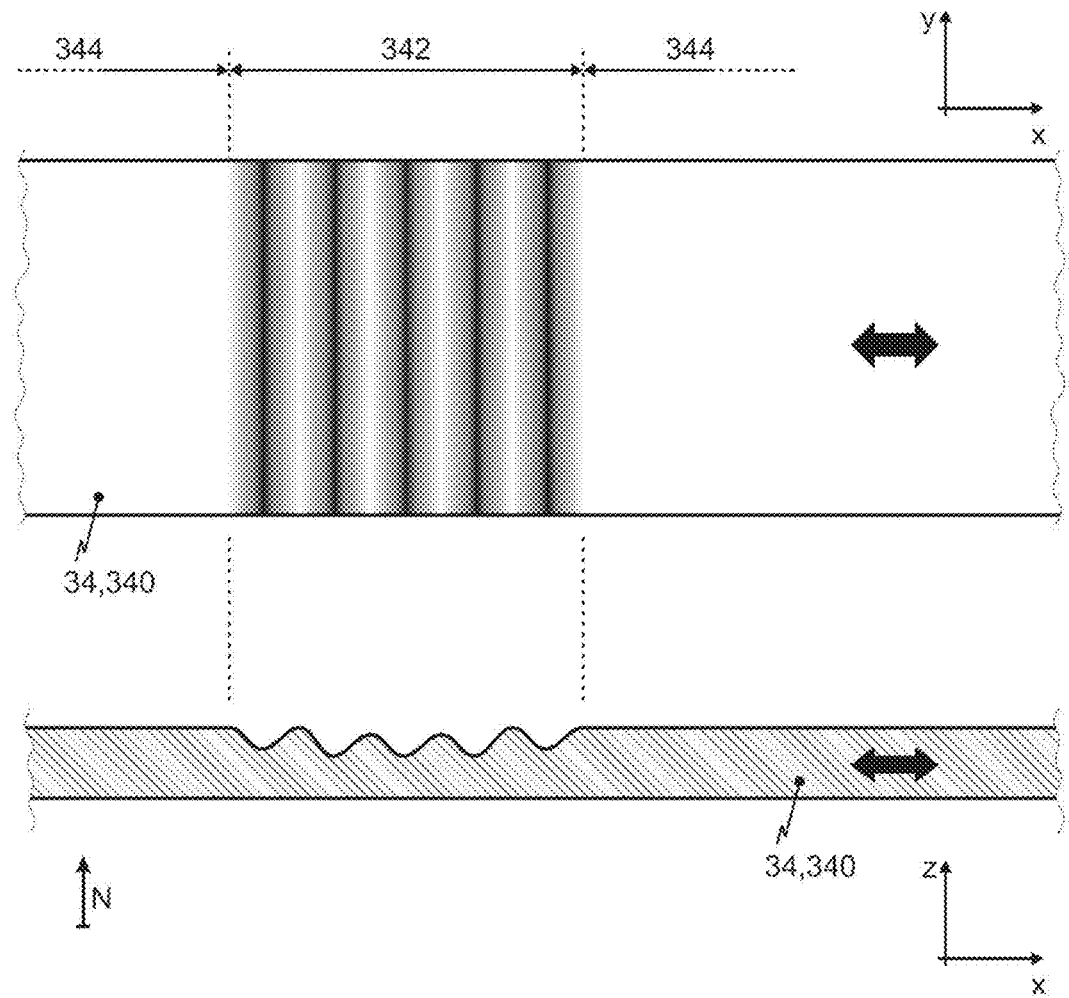
FIG. 7 shows different views of one part of a fourth configuration of the connecting device according to the invention.

FIG. 7 shows different views of one part, here the first film conductor track 340 and its direction of current flow, characterized by means of a double arrow, of a fourth configuration of the connecting device 3 according to the invention. In turn, a plan view is represented above, while a lateral view is represented below.

Along the direction of current flow, the first film conductor track 340 is here thinned in a wave-like manner in a second section 344, wherein the thinning is most pronounced in the middle of the second section. This configuration of the second section 344 is in particular advantageous if it is intended to be arranged in an arcuate section of the connecting device, possibly even beyond it.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic connecting device, designed as comprising a flexible film stack of a first and a second electrically conductive film and an electrically insulating film arranged therebetween, wherein:
   at least one of the first and the second electrically conductive films is structured uniformly and forms a plurality of film conductor tracks;
   a first one of the plurality of film conductor tracks has, in a first section, a first average thickness and, in a second section, a second average thickness;
   said second average thickness is at least 20% smaller than the first average thickness;
   the first film conductor track operably carries load currents of a power electronic switching device as part of a power semiconductor module, wherein the first film conductor track has an arcuate section and wherein the second section is arranged partially within the arcuate section; and
   wherein a first part of the second section protrudes beyond the arcuate section at a first end and a second part of the second section at a second end of said arcuate section does not protrude beyond the arcuate section.

2. The connecting device, according to claim 1, wherein:
   the film conductor tracks are supported by a substrate comprising line element conductor tracks separated by a recess;
   the arcuate section overlies portions of the line element conductor tracks and the recess between the conductor tracks.

3. The connecting device, according to claim 1, wherein:
   the first average thickness has a value between 80 μm and 250 μm.

4. A power semiconductor module, with a power electronic connecting device according to claim 1, comprising:
   a substrate which has a plurality of conductor tracks electrically insulated from one another;
   a power semiconductor component arranged on a first conductor track of said plurality of conductor tracks;
   said first conductor track has a contact surface on its side that faces away from the substrate, and to which said contact surface a film conductor track of an electrically conductive film is connected in an electrically conductive manner.

5. The power semiconductor module, according to claim 1, further comprising a substrate supporting the flexible film stack, wherein the second section comprises a wave profile surface facing away from the substrate.

6. The device according to claim 1, manufactured by a method comprising the step of:
   providing a connecting device, according to claim 1, wherein:
   the following method steps are carried out in the sequence of one of a-b-c, b-a-c, and b-c-a:
   a) forming a materially bonded connection, in particular an adhesive connection of the film stack made up of a first electrically conductive, an electrically insulating and a second electrically conductive film;
   b) structuring at least one of the electrically conductive films to form a plurality of film conductor tracks; and
   c) partially changing the thickness of a first film conductor track to form a first section with a first average thickness and a second section with a second average thickness.

7. The connecting device according to claim 6, wherein the method further comprises:
   generating the first average thickness of the first section by:
   (i) arranging a metal molding or a metal film in a materially-bonded manner; or
   (ii) arranging a metal in a materially-bonded manner by means of electrodeposition, on the free surface of the first section.

8. The connecting device of claim 7, therein the method further comprises:

the second average thickness of the second section is generated by one of a mechanical, a chemical and a combined mechanical-chemical thinning of this second section.

9. The connecting device of claim 8, wherein the method further comprises:
the surface contour generated through thinning is oriented to be one of flat, chaotic, and substantially transverse to the direction of current flow.

10. A power electronic connecting device, designed as a flexible film stack comprising first and second electrically conductive film and an electrically insulating film arranged therebetween, wherein:
at least one of the first and the second electrically conductive films is structured uniformly and forms a plurality of film conductor tracks supported by a substrate comprising line element conductor tracks separated by a recess;
a first one of the plurality of film conductor tracks has, in a first section, a first average thickness and, in a second section, a second average thickness;
said second average thickness is at least 20% smaller than the first average thickness;
the first film conductor track operably carries load currents of a power electronic switching device as part of a power semiconductor module, wherein the first film conductor track has an arcuate section and wherein the second section extends across the arcuate section;
wherein the second section of the arcuate section overlies portions of the line element conductor tracks and the recess between the conductor tracks.

11. The power electronic connecting device of claim 10, wherein:
the section is arranged partially within the arcuate section;
a first part of the second section protrudes beyond the arcuate section at a first end and a second part of the second section does not protrude beyond the arcuate section at a second end of said arcuate section.

12. The power electronic connecting device of claim 10, wherein:
the section is extends across arcuate section;
a first part of the second section protrudes beyond the arcuate section at a first end and a second part of the second section protrudes beyond the arcuate section at a second end of said arcuate section.

13. The power electronic connecting device of claim 10, further comprising a substrate supporting the flexible film stack, wherein the second section comprises a flat surface facing away from the substrate.

14. The power electronic connecting device of claim 10, further comprising a substrate supporting the flexible film stack, wherein the second section comprises a wave profile surface facing away from the substrate.

15. The power electronic connecting device according to claim 10, manufactured by a method comprising the step of:
providing a connecting device, according to claim 1, wherein the following method steps are carried out in the sequence of one of a-b-c, b-a-c, and b-c-a:
a) forming a materially bonded connection of the film stack made up of a first electrically conductive, an electrically insulating and a second electrically conductive film supported by a substrate comprising line element conductor tracks separated by a recess;
b) structuring at least one of the electrically conductive films to form a plurality of film conductor tracks; and
c) partially changing the thickness of a first film conductor track to form a first section with a first average thickness and a second section with a second average thickness at least 20% smaller than the first average thickness.

16. The power electronic connecting device according to claim 15, wherein the method further comprises:
generating the first average thickness of the first section by:
(i) arranging a metal molding or a metal film in a materially-bonded manner; or
(ii) arranging a metal in a materially-bonded manner by means of electrodeposition, on the free surface of the first section.

17. A power electronic connecting device, designed as a flexible film stack of a first and a second electrically conductive film and an electrically insulating film arranged therebetween, wherein:
at least one of the first and the second electrically conductive films is structured uniformly and forms a plurality of film conductor tracks;
a first one of the plurality of film conductor tracks has, in a first section, a first average thickness and, in a second section, a second average thickness;
said second average thickness is at least 20% smaller than the first average thickness;
the first film conductor track operably carries load currents of a power electronic switching device as part of a power semiconductor module, wherein the first film conductor track has an arcuate section and wherein the second section extends across the arcuate section;
a substrate supporting the flexible film stack, wherein the second section comprises a wave profile surface facing away from the substrate.

18. The connecting device, according to claim 17, wherein:
the section is arranged partially within the arcuate section;
a first part of the second section protrudes beyond the arcuate section at a first end and a second part of the second section does not protrude beyond the arcuate section at a second end of said arcuate section.

19. The connecting device, according to claim 17, wherein:
the section is extends across arcuate section;
a first part of the second section protrudes beyond the arcuate section at a first end and a second part of the second section protrudes beyond the arcuate section at a second end of said arcuate section.

20. The connecting device, according to claim 17, wherein:
the film conductor tracks are supported by a substrate carrying line element conductor tracks separated by a recess;
the arcuate section overlies portions of the conductor tracks and the recesses between the conductor tracks.

* * * * *